US006497990B1

(12) United States Patent
Blanchard et al.

(10) Patent No.: US 6,497,990 B1
(45) Date of Patent: Dec. 24, 2002

(54) HEAT SENSITIVE PRINTING PLATE PRECURSORS

(75) Inventors: Simon John Blanchard, Harrogate (GB); John Michael Kitteridge, Leeds (GB); Roland Robinson, Leeds (GB); Philip John Watkiss, Leeds (GB)

(73) Assignee: Agfa-Gevaert (BE)

( * ) Notice: Subject to any disclaimer, the term of this patent is extended or adjusted under 35 U.S.C. 154(b) by 0 days.

(21) Appl. No.: 10/174,277

(22) Filed: Jun. 18, 2002

Related U.S. Application Data

(60) Provisional application No. 60/307,410, filed on Jul. 24, 2001.

(30) Foreign Application Priority Data

Jun. 22, 2001 (EP) ............................................ 01000249

(51) Int. Cl.[7] ............................. G03F 7/11; G03F 7/09; G03F 7/36

(52) U.S. Cl. ..................... 430/302; 430/278.1; 430/616

(58) Field of Search ............................. 430/616, 278.1, 430/302

(56) References Cited

U.S. PATENT DOCUMENTS 5,916,734 A * 6/1999 Takagami et al. ........... 430/616
6,132,938 A 10/2000 Yoshida et al. ............. 430/616

FOREIGN PATENT DOCUMENTS

| | | | |
|---|---|---|---|
| EP | 1106349 A1 | | 6/2001 |
| GB | 2325891 A | | 12/1998 |
| WO | WO98/55310 | * | 12/1998 |

OTHER PUBLICATIONS

Search Report—EP 01 00 0249 (Dec. 7, 2001).

* cited by examiner

*Primary Examiner*—Richard L. Schilling
(74) *Attorney, Agent, or Firm*—Leydig, Voit & Mayer, Ltd.

(57) ABSTRACT

The present invention provides a method of preparing a lithographic printing plate, said method comprising:

providing a lithographic printing plate precursor comprising:

i) a grained and anodized aluminum substrate where the anodic weight is between 6.0 and 20 g/m$^2$, having coated thereon;

ii) a metallic layer; and image-wise exposing the precursor on an external drum thermal imaging device.

The method provides press ready plates showing high image quality, good press properties and high durability on press without the requirement for the use of costly intermediate film and developer chemistry, and the attendant inconvenience resulting from the use of these materials.

10 Claims, No Drawings

HEAT SENSITIVE PRINTING PLATE PRECURSORS

This application claims the benefit of U.S. Provisional Patent Application No. 60/307,410, filed Jul. 24, 2001, which is incorporated by reference.

FIELD OF THE INVENTION

This invention relates to the formation of images directly from electronically composed digital sources and is particularly concerned with the formation of images on lithographic printing plate precursors. More particularly, the invention relates to lithographic printing plate precursors that incorporate an imaging layer comprising metallic silver, and a method of preparing lithographic printing plates which do not require the use of chemical treatments.

BACKGROUND OF THE INVENTION

Lithographic printing is a process of printing from surfaces which have been prepared in such a way that certain areas are capable of accepting ink (oleophilic areas), whereas other areas will not accept ink (oleophobic areas). The oleophilic areas form the printing areas while the oleophobic areas form the background areas.

Plates for use in lithographic printing processes may be prepared using a photographic material that is made image-wise receptive or repellent to ink upon photo-exposure of the photographic material and subsequent chemical treatment. However, this method of preparation, which is based on photographic processing techniques, involves several steps, and therefore requires a considerable amount of time, effort and expense.

Consequently it has, for many years, been a long-term aim in the printing industry to form images directly from an electronically composed digital database, i.e. by a so-called "computer-to-plate" system. The advantages of such a system over the traditional methods of making printing plates are:

(i) the elimination of costly intermediate silver film and processing chemicals;

(ii) a saving of time; and (iii) the ability to automate the system with consequent reduction in labor costs.

The introduction of laser technology provided the first opportunity to form an image directly on a printing plate precursor by scanning a laser beam across the surface of the precursor and modulating the beam so as to effectively turn it on and off. In this way, radiation sensitive plates comprising a high sensitivity polymer coating have been exposed to laser beams produced by water cooled UV argon-ion lasers and electrophotographic plates having sensitivities stretching into the visible spectral region have been successfully exposed using low powered air-cooled argon-ion, helium-neon and semiconductor laser devices.

Imaging systems are also available which involve a sandwich structure that, on exposure to a heat generating infrared laser beam, undergoes selective (image-wise) delamination and subsequent transfer of materials. Such so-called peel-apart systems are generally used as replacements for silver halide films.

A digital imaging technique has been described in U.S. Pat. No. 4,911,075 whereby a so-called driographic plate which does not require dampening with an aqueous fountain solution to wet the non-image areas during printing is produced by means of a spark discharge. In this case, a plate precursor comprising an ink-repellent coating containing electrically conductive particles coated on a conductive substrate is used and the coating is ablatively removed from the substrate. Unfortunately, however, the ablative spark discharge provides images having relatively poor resolution.

It is known to improve this feature by the use of lasers to obtain high resolution ablation as described, for example, by P E Dyer in "Laser Ablation of Polymers" (Chapter 14 of "Photochemical Processing of Electronic Materials", Academic Press, 1992, p359–385). Until recently, imaging via this method generally involved the use of high power carbon dioxide or excimer lasers. Unfortunately, such lasers are not well suited to printing applications because of their high power consumption and excessive cost, and the requirement for high pressure gas handling systems. Recent developments have, however, led to the availability of more suitable infrared diode lasers, which are compact, highly efficient and very economical solid state devices. High power versions of such lasers, which are capable of delivering up to 3000 mJ/cm$^2$, are now commercially available.

Coatings that may be imaged by means of ablation with infrared radiation have previously been proposed. Thus, for example, a proofing film in which an image is formed by image-wise ablation of a colored layer on to a receiver sheet is described in PCT Application No 90/12342. This system is, however, disadvantageous in requiring a physical transfer of material in the imaging step, and such methods tend to give rise to inferior image resolution.

Much superior resolution is obtained by means of the ablation technique described in European Patent No 649374, wherein a driographic printing plate precursor is imaged digitally by means of an infra-red diode laser or a YAG laser, and the image is formed directly through the elimination of unwanted material. The technique involves exposing a plate precursor, incorporating an infra-red radiation ablatable coating covered with a transparent cover sheet, by directing the beam from an infra-red laser at sequential areas of the coating so that the coating ablates and loses its ink repellency in those areas to form an image, removing the cover sheet and ablation products, and inking the image.

A heat mode recording material is disclosed in U.S. Pat. No. 4,034,183 that comprises an anodized aluminum support coated with a hydrophilic layer. On image-wise exposure using a laser, the exposed areas are rendered hydrophobic, and thereby accept ink.

Japanese patent application laid open to public inspection No 49-117102 (1974) discloses a method for producing printing plates wherein a metal is incorporated in the imaging layer of a printing plate precursor which is imaged by irradiation with a laser beam modulated by electric signals. Typically, the plate precursor comprises a metal base, such as aluminum, coated with a resin film, which is typically nitrocellulose, and on top of which has been provided a thin layer of copper. The resin and metal layers are removed in the laser-struck areas, thereby producing a printing plate. The disadvantage of this system, however, is that two types of laser beam irradiation are required in order to remove firstly the copper (e.g. by means of an argon-ion laser) and then the resin (e.g. with a carbon dioxide laser); hence, the necessary equipment is expensive.

Subsequently a method of printing plate production which obviated the requirement for a second laser exposure was disclosed in Japanese patent application laid open to public inspection No 52-37104 (1977). Thus, a printing plate precursor comprising a support, typically aluminum, an anodic aluminum oxide layer, and a layer of brass, silver, graphite or, preferably, copper is exposed to a laser beam of high energy density in order to render the exposed areas hydrophilic to yield a printing plate. The printing plate precursor is, however, of rather low sensitivity and requires the use of a high-energy laser for exposure.

An alternative heat mode recording material for making a lithographic printing plate is disclosed in European Patent No 609941, which comprises a support having a hydrophilic surface, or provided with a hydrophilic layer, on which is coated a metallic layer, on top of which is a hydrophobic layer having a thickness of less than 50 nm. A lithographic printing plate may be produced from the said material by image-wise exposing to actinic radiation, thereby rendering the exposed areas hydrophilic and repellent to greasy ink.

Conversely, European Patent No 628409 discloses a heat mode recording material for making a lithographic printing plate which comprises a support and a metallic layer, on top of which is provided a hydrophilic layer having a thickness of less than 50 nm. A lithographic printing plate is produced by image-wise exposing the material to actinic radiation in order to render the exposed areas hydrophobic and receptive to greasy ink.

In each of the two foregoing heat mode recording materials, however, difficulties in printing will be encountered. On exposure of the materials to actinic radiation, the energy is converted to heat in the image areas by interaction with the metallic layer, thereby destroying the hydrophilicity or hydrophobicity—depending on the material employed—of the topmost layer in those areas. Consequently, the surface of the metallic layer becomes exposed, and the success of the printing operation is dependent upon differences in hydrophilicity and oleophilicity between the metallic surface and the hydrophilic or hydrophobic layer, as the case may be. Since the metallic layer functions as the hydrophobic surface in one case, and as the hydrophilic surface in the alternative case, it would be expected that such differences in hydrophilicity and oleophilicity would not be sufficiently clearly defined so as to provide a satisfactory printing surface. Furthermore, when a hydrophilic layer is present, and the metallic surface functions as the oleophilic areas of the plate, image areas will necessarily be printed from the metallic surface; such an arrangement is known to be unsatisfactory, and to result in difficulties in achieving acceptable printing quality.

Subsequently, a series of PCT patent applications (WO 98/55307-WO 98/55311 and WO 98/55330-WO 98/55332) has disclosed heat mode recording materials comprising a grained and anodized aluminum substrate and an ablatable metallic layer, said materials providing lithographic printing plates showing high image quality and excellent printing properties. Also described are imaging methods for the preparation of the said printing plates, these methods relying on direct-to-plate exposure techniques and thereby obviating the requirement for the use of costly intermediate film or processing developers after exposure.

Individual specifications within this series of patent applications also disclose various distinct additional features such as the inclusion of a further layer on top of the metallic layer; for example, WO 98/55311 teaches the presence of a transparent cover sheet or layer of material to collect ablated debris, whereas WO98/55308 describes a hydrophobising layer comprising a proteolytic enzyme and an oleophilising agent, this layer improving the ink-accepting properties of image areas and thereby increasing the degree of differentiation between hydrophilic and oleophilic areas.

An area of concern with heat mode recording materials having an ablatable metallic layer is that the high thermal conductivity of the metallic layer can result in thermal losses into the substrate being very high. To minimize thermal losses the laser pulse exposure time (laser spot dwell time) should ideally be very short. It is known from the prior art (D. E. Hare, S. T. Rhea, D. D. Dlott, R. J. D'Amato, and T. E. Lewis, "Pulse Duration Dependence of Lithographic Printing Plate Imaging by Near-Infrared Lasers", J. Imaging Science and Technology, Vol. 42, no.2, March/April 1998, pages 187–193) that the reason that low-intensity sources do not image laser photothermal media is that generally these media need to reach a rather high threshold temperature $T_{th}$ before the chemical or physical processes responsible for image formation begin to occur. However, during exposure, laser heating of the medium must compete with thermal conduction away from the heated region. For low-intensity sources, the extent of thermal conduction ensures that $T_{th}$ can never be reached, whereas for higher intensity sources that produce rapid heating, the effects of thermal conduction can be overcome.

Laser devices for the exposure of thermally sensitive printing plates may be conveniently divided into two types:

(1) Internal drum type; and (2) External drum type.

With an internal drum-type laser, the printing plate is mounted on the inside of a stationary drum. The modulated beam from a high power IR laser, usually a YAG laser, is scanned across the plate by means of a galvanometer mirror or rotating prism and the laser head traverses across the plate. The dwell time of the laser spot on the plate is typically of the order of 0.02 microseconds. Examples of such exposure devices are a Gerber Crescent C42T platesetter and an Agfa Galileo Talant platesetter.

In the case of an external drum laser, the printing plate is mounted on the outside of a rotating drum. The modulated laser beam is typically from a diode laser; a diode laser array may be used. The laser head traverses across the rotating drum to expose the plate, but the dwell time of the laser spot on the plate is much longer than that for the internal drum and is usually 0.5 to 20 microseconds, typically 5 microseconds. One example of such an exposure device is a Creo Trendsetter.

In view of the short exposure times employed with internal drum lasers, these devices are well suited to the exposure of heat mode recording materials having an ablatable metal layer. However, it follows from the teaching of Hare et al that the longer exposure times associated with external drum laser devices would lead to the expectation that these devices could not be used to produce satisfactory images by ablation of the imaging layer with such heat mode recording materials, in view of the competitive effects of conduction which would lead to loss of heat into the substrate.

Commercially, however, external drum lasers are in much more common use than internal drum lasers and it is, therefore, clearly desirable that it should be possible to expose heat mode recording materials having an ablatable metal layer by means of such external drum devices. Consequently, the present invention concerns exposure devices of the external drum type and the invention seeks to provide a lithographic printing plate precursor that can be satisfactorily exposed on an external drum type thermal imaging device. Surprisingly, the present inventors have found that by providing a plate precursor having a grained and anodized aluminum substrate with an anodic weight which lies within a certain specific range, it is possible to obtain a plate which does not suffer from these expected problems, thereby overcoming the prejudices resulting from the teachings of the prior art and allowing for the efficient exposure of such a recording material by means of an imaging device of the external drum type.

SUMMARY OF THE INVENTION

Thus, according to the present invention there is provided a method of preparing a lithographic printing plate, said method comprising:

(a) providing a lithographic printing plate precursor comprising:
  (i) a grained and anodized aluminum substrate comprising an anodic aluminum oxide film, wherein the anodic weight of the aluminum oxide film is between 6.0 and 20 g/m$^2$, having coated thereon;
  (ii) a metallic layer; and (a) image-wise exposing said precursor on an external drum thermal imaging device.

DETAILED DESCRIPTION OF THE INVENTION

The aluminum substrate is brush grained or electrochemically grained with an alternating electric current in a bath containing mineral or organic acids, or their mixtures, to give a roughened surface with a Center Line Average (CLA) of between 0.2 $\mu$m and 1.5 $\mu$m, preferably between 0.4 $\mu$m and 1.0 $\mu$m. Preferably the aluminum is electrochemically grained in a mixture of acetic acid and hydrochloric acid according to the process disclosed in British Patent No. 1598701.

The grained aluminum is then chemically cleaned in either mineral acid or aqueous alkali to remove smut that may be present in the form of metal, metal oxides and metal hydroxides. Phosphoric acid, sulfuric acid or sodium hydroxide may suitably be used for this purpose. Typically, phosphoric acid is employed at a concentration of 50 to 250 g/l and a temperature of 40 to 50° C.

Subsequently, the aluminum is electrochemically anodized with a direct electric current in a bath containing mineral or organic acids, or their mixtures, to provide an aluminum oxide film with an anodic weight of between 6.0 g/m$^2$ and 20.0 g/m$^{2,}$ preferably between 6.0 g/m$^2$ and 15.0 g/m$^2$. The preferred anodizing medium is sulfuric acid. Typical conditions involve treatment of the aluminum in 100 to 150 g/l sulfuric acid for 10 to 60 seconds at 40 to 50° C. and an applied potential of 10 to 30 V. It is preferable that the said aluminum oxide film should be substantially porous, and that the pores should extend substantially from the aluminum/aluminum oxide interface to the surface of the substrate, such that in excess of 95% of the pores have a diameter which lies in the range between 5 nm and 100 nm. Optionally, the surface of the pores may be chemically treated in order to partly or completely seal the substrate. Examples of such treatments are described in PCT patent application No. PCT/EP98/03474, a preferred means of treatment being with a solution comprising potassium hexafluorozirconate.

It appears that the provision of an anodic layer having the specific thickness required by the present invention results in a significant reduction in the efficiency of heat dissipation from the ablatable metal layer into the aluminum substrate, without compromising the printing properties of the resulting plate. It is the ability to provide a balance between satisfying commercial requirements in terms of the exposure of heat mode recording materials of the type described, and their subsequent performance during lithographic printing operations that lies at the heart of the present invention.

Optionally, the aluminum substrate material may be laminated to other materials, such as paper or various plastics materials, in order to enhance its flexibility, whilst retaining the good dimensional stability associated with aluminum.

The metallic layer, which is applied to the grained and anodized surface of the aluminum, may comprise one or a combination of several metals, specific examples of which include copper, bismuth and brass. Most preferably, however, the metallic layer comprises a silver layer. The thickness of the metallic layer is preferably from 1 nm to 100 nm, most preferably from 10 nm to 50 nm.

Various techniques are available for the application of the metallic layer to the grained and anodized aluminum substrate, including vapor or vacuum deposition or sputtering. In the case where the metal layer comprises a silver layer, however, the most preferred method for applying the layer involves the treatment of a silver halide material according to the silver salt diffusion transfer process.

In the diffusion transfer process, a silver halide emulsion layer is transformed by treatment with a so-called silver halide solvent, into soluble silver complex compounds which are then allowed to diffuse into an image receiving layer and are reduced therein by means of a developing agent, generally in the presence of physical development nuclei, to form a metallic silver layer.

Two such systems are available: a two sheet system in which a silver halide emulsion layer is provided on one element, and a physical development nuclei layer is provided on a second element, the two elements are placed in contact in the presence of developing agent(s) and silver halide solvent(s) in the presence of an alkaline processing liquid, and subsequently peeled apart to provide a metallic silver layer on the second element; and a single sheet system wherein the element is provided with a physical development nuclei layer, a silver halide emulsion layer is provided on top thereof, the element is treated with developing agent(s) and silver halide solvent(s) in the presence of an alkaline processing liquid, and the element is washed to remove spent emulsion layer and leave a metallic silver layer which is formed in the layer containing physical development nuclei.

Alternatively, the diffusion transfer process may be used to apply a metallic silver layer by overall exposing a positive working silver halide emulsion layer to form a latent negative image which is then developed in contact with a physical development nuclei layer to form a metallic silver layer. Again, the process may be carried out using either a single sheet or a double sheet system.

The principles of the silver complex diffusion transfer process are fully described in the publication "Photographic Silver Halide Diffusion Processes" by Andre Rott and Edith Weyde, The Focal Press, London and New York, 1972, and further detail may be gleaned by reference thereto.

Preferably a transparent cover sheet or a layer of material is present on the metallic layer before exposure. This allows loosely bound debris that is produced in the image areas on exposure to be trapped and thus prevented from being released to the atmosphere and is disclosed in WO 98/55311. Preferably this top layer of material is water soluble and contains thermal sensitizing agents as described in European patent application No. 00204272, stain-reducing agents as taught by European patent application No. 01000002, proteolytic enzymes, silver oleophilising agents, and desensitizing compounds.

Suitable enzymes for use in the above composition may include, for example, trypsin, pepsin, ficin, papain or the bacterial proteases or proteinases. Oleophilising compounds may be chosen from those disclosed on pages 105 to 106 of "Photographic Silver Halide Diffusion Processes" by Andre Rott and Edith Weyde, but mercapto compounds and cationic surfactants such as quaternary ammonium compounds are of particular value. Carbohydrates such as gum arabic, dextrin and inorganic polyphosphates such as sodium hexametaphosphate provide useful desensitizing compounds in these compositions.

The plate may be directly transferred to a printing press following exposure, without the requirement for any intermediate treatment, since the hydrophilic materials are readily removable from the silver image in the printing areas by means of aqueous washing; such washing is effectively achieved by the action of the typical aqueous fount solutions and fount-ink mixtures commonly used on printing presses, and the hydrophilic material is thereby replaced by a film of ink in image areas and fount in background, non-image areas.

Alternatively after exposure, the plate may be subjected to a manual or automatic scrubbing and/or soaking treatment with an aqueous solution in order to remove any top layer; this procedure, which is described in WO 98/55309, additionally facilitates removal of any silver particles remaining in exposed areas, and enables the cosmetic appearance of the plate to be improved prior to press operations. Following, or concurrent with, this cleaning step, the plate can be prepared for printing operations by further treatment with an aqueous composition comprising at least one oleophilising agent for the image areas and at least one compound capable of desensitizing the non-image areas to ink. In this way, it is possible to ensure good ink acceptance in image areas and a high degree of hydrophilicity in background areas, thus enabling a good start-up on press to be achieved.

The method of the present invention provides press ready plates showing high image quality, good press properties and high durability on press without the requirement for the use of costly intermediate film and developer chemistry, and the attendant inconvenience resulting from the use of these materials.

The following examples are illustrative of the invention, without placing any limit on the scope thereof:

EXAMPLES

Example 1

A sheet of aluminum was degreased in a 5% w/w aqueous solution of sodium hydroxide, electrochemically grained with an alternating electric current in a mixture of acetic and hydrochloric acids according to the method disclosed in British Patent No. 1598701, cleaned with an aqueous solution of phosphoric acid and then anodized for various times with a direct electric current in 100 g/l sulfuric acid solution at 450° C.

The sheet was rinsed with water to remove residual acid and a Carey Lea colloidal dispersion of silver stabilized with ammonium polyacrylate was applied to the grained and anodized surface to give a coating weight of 2.5 $mg/m^2$ of silver, and this was then further coated with a gelatino-silver chlorobromide dispersion to give a coating weight of 2 $g/m^2$ and a silver coating weight of 0.8 $g/m^2$.

A diffusion transfer developer was prepared comprising an aqueous solution containing 11% w/w sodium sulfite, 2% w/w hydroquinone, 0.6% w/w Phenidone (l-phenyl-3-pyrazolidone), 1% w/w sodium thiosulphate and 3% w/w 2-methylaminoethanol. The pH of the developer solution was adjusted to 12.8 by the addition of sodium hydroxide.

The above plate precursor was dipped into the developer at 20° C. for 20 seconds, and then rinsed with warm water containing proteolytic enzyme to remove residual coating and leave a physically developed silver layer, with 0.5 $g/m^2$ silver, on the grained and anodized aluminum substrate.

The silver layer was then coated with a solution containing sodium 1-octyl-5-mercaptotetrazole plus desensitizers as in example 2 of European patent application No. 00204272 to give a dry coat weight of 0.1 $g/m^2$.

The plate was exposed at different energies on a Creo Trendsetter external drum imagesetter. The exposed areas were qualitatively assessed as detailed in Table 1.

TABLE 1

| Score | Observation |
|---|---|
| 0 | No image visible |
| 1 | Exposed areas darker than non exposed areas |
| 2 | Exposed areas starting to turn gold in color |
| 3 | Exposed areas gold in color |
| 4 | Some ablation of silver in exposed areas |
| 5 | Silver completely removed in exposed areas |

The exposed plate was then wiped over with a damp cloth and the plate re-assessed.

The above procedure was repeated but with the anodizing time changed so as to give the aluminum plates different anodic weights. The results obtained are shown in Table 2.

TABLE 2

| | Exposure energy, $mJ/cm^2$ | | |
|---|---|---|---|
| Anodic weight, $g/m^2$ | 170 | 283 | 609 |
| 1.6 | 1 | 1 | 1 |
| 3.4 | 1 | 2 | 2 |
| 7.6 | 1 | 2 | 3 |
| 10.0 | 1 | 2 | 3 |

After wiping over with a damp cloth the ratings were as outlined in Table 3.

TABLE 3

| | Exposure energy, $mJ/cm^2$ | | |
|---|---|---|---|
| Anodic weight, $g/m^2$ | 170 | 283 | 609 |
| 1.6 | 1 | 1 | 1 |
| 3.4 | 1 | 2 | 2 |
| 7.6 | 1 | 2 | 4 |
| 10.0 | 1 | 2 | 5 |

Example 2

The same procedure was followed as in example 1 except that after anodizing the plate was dipped in a 5 g/l solution of potassium hexafluorozirconate for 36 seconds at 45° C., washed and dried.

The results obtained are outlined in Table 4.

TABLE 4

| | Exposure energy, mJ/cm$^2$ | | |
|---|---|---|---|
| Anodic weight, g/m$^2$ | 170 | 283 | 609 |
| 1.6 | 1 | 1 | 1 |
| 3.4 | 1 | 2 | 3 |
| 7.6 | 1 | 2 | 4 |
| 10.0 | 1 | 2 | 5 |

The plate was wiped over with a damp cloth to give the ratings shown in Table 5.

TABLE 5

| | Exposure energy, mJ/cm$^2$ | | |
|---|---|---|---|
| Anodic weight, g/m$^2$ | 170 | 283 | 609 |
| 1.6 | 1 | 1 | 1 |
| 3.4 | 1 | 2 | 3 |
| 7.6 | 1 | 2 | 5 |
| 10.0 | 1 | 2 | 5 |

We claim:

1. A method of preparing a lithographic printing plate, said method comprising:

providing a lithographic printing plate precursor comprising:

i) a grained and anodized aluminum substrate comprising an anodic aluminum oxide film wherein the anodic weight of the aluminum oxide film is between 6.0 and 20 g/m$^2$, having coated thereon;

ii) a metallic layer;

and image-wise exposing the precursor on an external drum thermal imaging device.

2. A method as claimed in claim 1 wherein the aluminum substrate is brush grained or electrochemically grained to give a roughened surface with a Center Line Average (CLA) of between 0.2 μm and 1.5 μm.

3. A method as claimed in claim 1 wherein said grained aluminum substrate is electrochemically anodized with direct electric current at an applied potential of 10 to 30 V for 10 to 60 seconds in a bath comprising 100 to 150 g/l sulfuric acid at 40 to 50° C.

4. A method as claimed in claim 1 wherein the thickness of the metallic layer is from 1 nm to 100 nm.

5. A method as claimed in claim 1 wherein the metallic layer that is applied to the grained and anodized surface of the aluminum comprises a silver layer.

6. A method as claimed in claim 5 wherein the silver layer is applied according to the silver salt diffusion transfer process.

7. A method as claimed in claim 1 wherein a transparent cover sheet or a layer of material is present on top of the metallic layer before exposure.

8. A method as claimed in claim 1 wherein the top layer of material is water soluble and contains thermal sensitizing agents, stain-reducing agents, proteolytic enzymes, silver oleophilising agents, and desensitizing compounds.

9. A method as claimed in claim 1 wherein after exposure the plate is subjected to a manual or automatic scrubbing and/or soaking treatment with an aqueous solution in order to remove any top layer.

10. A method as claimed in claim 1 wherein the plate is prepared for printing operations by treatment with an aqueous composition comprising at least one oleophilising agent and at least one compound capable of desensitizing the non-image areas to ink.

* * * * *